United States Patent
Tamura et al.

(10) Patent No.: US 8,076,685 B2
(45) Date of Patent: Dec. 13, 2011

(54) NITRIDE SEMICONDUCTOR DEVICE HAVING CURRENT CONFINING LAYER

(75) Inventors: Satoshi Tamura, Osaka (JP); Ryo Kajitani, Osaka (JP)

(73) Assignee: Panasonic Corporation, Osaka (JP)

( * ) Notice: Subject to any disclaimer, the term of this patent is extended or adjusted under 35 U.S.C. 154(b) by 118 days.

(21) Appl. No.: 12/556,946

(22) Filed: Sep. 10, 2009

(65) Prior Publication Data

US 2010/0072516 A1     Mar. 25, 2010

(30) Foreign Application Priority Data

Sep. 25, 2008   (JP) .................. 2008-246362

(51) Int. Cl.
*H01L 33/00* (2010.01)
(52) U.S. Cl. ............... 257/97; 257/12; 257/13; 257/79; 257/94; 257/96; 257/103; 257/183; 257/190; 257/E33.003; 257/E33.005; 257/E33.006; 257/E33.011; 257/E33.023; 257/E33.025; 257/E33.026; 257/E33.027; 257/E33.028; 257/E33.031; 257/E33.032; 257/E33.033; 257/E33.034
(58) Field of Classification Search ........... 257/E33.023, 257/E33.025, E33.026, E33.027, 12, 13, 257/79, 94, 96, 97, 103, 183, 190, E33.003, 257/E33.005, E33.006, E33.011, E33.028, 257/E33.031, E33.032, E33.033, E33.034
See application file for complete search history.

(56) References Cited

U.S. PATENT DOCUMENTS

| | | | |
|---|---|---|---|
| 6,580,736 B1 * | 6/2003 | Yoshie et al. | 372/45.01 |
| 2002/0123166 A1 | 9/2002 | Hasegawa et al. | |
| 2005/0279993 A1 | 12/2005 | Tamura et al. | |
| 2007/0195843 A1 | 8/2007 | Tamura et al. | |
| 2008/0144684 A1 | 6/2008 | Tamura et al. | |

FOREIGN PATENT DOCUMENTS

| | | |
|---|---|---|
| JP | 08-107247 | 4/1996 |
| JP | 2000-277854 | 10/2000 |
| JP | 2001-068786 | 3/2001 |
| JP | 3439168 | 6/2003 |
| JP | 3464991 | 11/2003 |
| JP | 2008-282836 | 11/2008 |

* cited by examiner

*Primary Examiner* — Jay C Kim
(74) *Attorney, Agent, or Firm* — McDermott Will & Emery LLP

(57) ABSTRACT

A nitride semiconductor device includes an active layer formed between an n-type cladding layer and a p-type cladding layer, and a current confining layer having a conductive area through which a current flows to the active layer. The current confining layer includes a first semiconductor layer, a second semiconductor layer and a third semiconductor layer. The second semiconductor layer is formed on and in contact with the first semiconductor layer and has a smaller lattice constant than that of the first semiconductor layer. The third semiconductor layer is formed on and in contact with the second semiconductor layer and has a lattice constant that is smaller than that of the first semiconductor layer and larger than that of the second semiconductor layer.

8 Claims, 13 Drawing Sheets

NITRIDE SEMICONDUCTOR DEVICE HAVING CURRENT CONFINING LAYER

CROSS-REFERENCE TO RELATED APPLICATION

The disclosure of each of Japanese Patent Application No. 2008-246362 filed on Sep. 25, 2008, and Japanese Patent Application No. 2009-163649 filed on Jul. 10, 2009, including specification, drawings and claims is incorporated herein by reference in its entirety.

BACKGROUND OF THE INVENTION

The present disclosure relates to nitride semiconductor devices, and more particularly, relates to a nitride semiconductor device including a buried current confining layer.

Currently, much attention has been given to group III-V nitride compound semiconductor, i.e., so-called nitride semiconductor, typified by gallium nitride (GaN), having a chemical formula $B_wAl_xIn_yGa_zN$ (where $0 \leq w, x, y, z \leq 1$ and $w+x+y+z=1$). Specifically, nitride semiconductor is formed of boron (B), aluminum (Al), gallium (Ga) and indium (In) which are group III elements, and nitride (N) which is a group V element.

For example, light emitting diodes (LED) employing nitride semiconductor have been used for large display devices, traffic lights, and the like. Also, white LEDs which use a combination of an LED employing nitride semiconductor and a phosphor have been already commercialized, and are expected to be used to replace currently used illumination devices in future, if the luminous efficiency of white LEDs is improved.

With the increasing development of blue-violet semiconductor laser diodes employing nitride semiconductor, the market size thereof grows each year. In a blue-violet semiconductor laser diode, the diameter of a beam spot on an optical disc can be reduced, compared to semiconductor laser diodes emitting light in the red range and the infrared range, used for optical discs such as known CDs, DVDs and the like. Thus, the memory density of optical discs can be increased.

Gallium nitride materials have excellent physical properties, i.e., a high dielectric breakdown electric field, a high saturated drift velocity for electrons in a high electric field, and a high density of two-dimensional electron gas at a heterojunction. Thus, gallium nitride materials are regarded as one of promising materials for electronic devices.

To fabricate a semiconductor device such as an optical device, an electric device or the like, employing nitride semiconductor, a technique for forming nitride semiconductor into a desired shape is required. To form a current confining structure of a laser diode, a gate recess of a FET and the like, a nitride semiconductor layer has to be selectively etched. In general, dry etching is used for etching nitride semiconductor (see, for example, the specification of Japanese Patent No. 3464991).

SUMMARY OF THE INVENTION

However, when a nitride semiconductor layer is etched using dry etching, the following problems arise.

A first problem is as follows. In dry etching, ions are accelerated toward a semiconductor layer to collide with it, thereby etching the semiconductor layer. Thus, great damage on the semiconductor layer is caused. Therefore, when a recess is formed by dry etching, device properties are degraded due to damage caused during etching.

Dry etching is a technique which is highly controllable. However, during dry etching, variations of a few percent occur. Thus, for example, when an AlGaN layer formed on a GaN layer is removed, overetching and underetching are unavoidable, thus resulting in variations in device properties.

Therefore, in an etching method used in fabrication of a semiconductor device, it is ideal that damage caused by etching is small and etching is automatically stopped at an interface between two semiconductor layers.

The present inventors discovered conditions for wet etching where damage caused by etching can be reduced and also etching can be stopped automatically at or near an interface between two semiconductor layers.

An object of this disclosure is to solve the above-described problems, based on the findings of the present inventors, and achieve a nitride semiconductor device in which degradation of device properties due to etching damage and variations in device properties due to variations in etching are small.

To achieve the above-described object, according to the present disclosure, a nitride semiconductor device includes a stacked layer body in which, between a layer having a larger lattice constant and a layer having a smaller lattice constant, a layer having a smaller lattice constant than the smaller lattice constant is provided.

Specifically, a first example nitride semiconductor device includes an n-type cladding layer formed on a substrate; an active layer formed on the n-type cladding layer; a current confining layer formed on the active layer and having a recess portion; and a p-type cladding layer formed on the current confining layer. The current confining layer includes a first semiconductor layer, a second semiconductor layer formed on and in contact with the first semiconductor layer, and a third semiconductor layer formed on and in contact with the second semiconductor layer, the second semiconductor layer has a smaller lattice constant than that of the first semiconductor layer, the third semiconductor layer has a lattice constant that is smaller than that of the first semiconductor layer and larger than that of the second semiconductor layer, and the recess portion of the current confining layer from which parts of the third semiconductor layer and the second semiconductor layer are removed serves as a conductive area through which a current flows to the active layer.

The above-described structure of the first example nitride semiconductor device allows etching stop to automatically occur with a remaining portion of the second semiconductor layer having a very small thickness around an interface of the first semiconductor layer and the second semiconductor layer with high reproducibility when a recess portion to serve as the conductive area is formed by performing wet etching to the current confining layer. Accordingly, variations in semiconductor device properties due to variations in etching can be suppressed.

A second example nitride semiconductor device includes: an n-type cladding layer formed on a substrate; an active layer formed on the n-type cladding layer; a current confining layer formed on the active layer and having a recess portion; and a p-type cladding layer formed on the current confining layer. The current confining layer includes a first semiconductor layer and a second semiconductor layer formed on and in contact with the first semiconductor layer, the first semiconductor layer has a superlattice structure in which two or more stacking cycles of a first layer and a second layer having a larger lattice constant than that of the first layer are repeated, and the recess portion of the current confining layer from which parts of the second semiconductor layer and the first semiconductor layer are removed serves as a conductive area through which a current flows to the active layer.

In the second example nitride semiconductor device, multiple ones of the interface of the first layer and the second layer in which the etching stop function occurs exist. Thus, etching for forming the conductive area can be automatically stopped with high reproducibility. Accordingly, variations in semiconductor device properties due to variations in etching can be suppressed.

A third example nitride semiconductor device includes: a first nitride semiconductor layer formed on a substrate; a second nitride semiconductor layer formed on and in contact with the first nitride semiconductor layer and having a smaller lattice constant than that of the first nitride semiconductor layer; and a third nitride semiconductor layer formed on and in contact with the second nitride semiconductor layer and having a lattice constant that is smaller than that of the first nitride semiconductor layer and larger than that of the second nitride semiconductor layer. The third nitride semiconductor layer and the second nitride semiconductor layer have a recess portion formed so that the recess portion passes through the third nitride semiconductor layer and part of the second semiconductor layer remains under the recess portion.

The above-described structure of the third example nitride semiconductor device allows etching stop to occur with a remaining portion of the second nitride semiconductor layer having a very small thickness around an interface of the first nitride semiconductor layer and the second nitride semiconductor. Thus, the recess portion can be formed in the second nitride semiconductor layer so as not to pass through the first nitride semiconductor layer with high reproducibility. For example, by using the recess portion as a gate recess, a heterojunction transistor can be formed with high reproducibility.

An example method for fabricating a nitride semiconductor device includes the steps of: a) forming a first nitride semiconductor layer, a second nitride semiconductor layer and a third nitride semiconductor layer in this order on a substrate; and b) forming a recess portion by selectively removing parts of the third nitride semiconductor layer and the second nitride semiconductor layer. The second nitride semiconductor layer is formed on and in contact with the first nitride semiconductor layer and has a smaller lattice constant than that of the first nitride semiconductor layer, the third nitride semiconductor layer is formed on and in contact with the second nitride semiconductor layer and has a lattice constant that is smaller than that of the first nitride semiconductor layer and larger than that of the second nitride semiconductor layer, and in the step b), photoelectrochemical etching is performed.

In the example method, etching can be stopped with a remaining portion of the second nitride semiconductor layer having a small thickness around an interface of the first nitride semiconductor layer and the second nitride semiconductor and with high reproducibility. Thus, the recess portion can be formed in a simple manner so as not to pass through the first nitride semiconductor layer. Therefore, a nitride semiconductor device including a current confining layer, a gate recess or the like can be formed with high yield.

BRIEF DESCRIPTION OF THE DRAWINGS

FIG. 4A is a cross-sectional view of the nitride semiconductor device. FIG. 4B is an enlarged cross-sectional view of a conductive area.

FIG. 7A is a cross-sectional view of the nitride semiconductor device. FIG. 7B is an enlarged cross-sectional view of a conductive area.

DETAILED DESCRIPTION OF THE INVENTION

First Embodiment

First, a basis for wet etching used in a first embodiment of the present invention will be described with reference to the accompanying drawings. In this embodiment, as wet etching, photoelectrochemical (PEC) etching in which a nitride semiconductor layer being irradiated with light is reacted with an alkaline solution is used.

Figure 1:
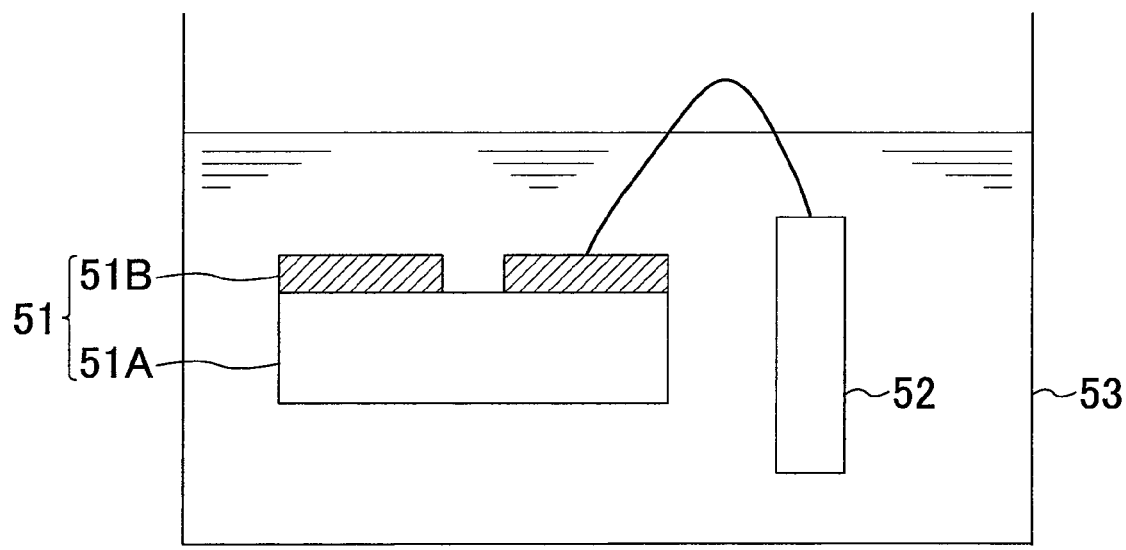
FIG. 1 is a cross-sectional view illustrating a method for etching a nitride semiconductor layer according to a first embodiment of the present invention.

FIG. 1 schematically illustrates PEC etching. As shown in FIG. 1, etching is performed by immersing a nitride semiconductor layer 51 coupled to a cathode 52 made of platinum (Pt) or the like in an alkaline etching solution 53 such as potassium hydrate (KOH) and then irradiating it with light. In PEC etching, n-type nitride semiconductor is selectively etched, and p-type nitride semiconductor is not etched.

Various publications (see, for example, Appl. Phys. Lett., vol. 72, No. 5, 1998, pp. 560-562) have described PEC etching of n-type nitride semiconductor. Therefore, when an n-type nitride semiconductor layer is stacked on a p-type nitride semiconductor layer, it is expected that only the n-type nitride semiconductor layer is etched without etching the p-type nitride semiconductor layer. However, it has not yet been reported that, by performing PEC etching after an n-type nitride semiconductor layer was formed on a p-type nitride semiconductor layer, only the n-type nitride semiconductor layer could been selectively removed.

As a result of examinations by the present inventors, it has been found that when a first nitride semiconductor layer 51A is p-type and then PEC etching is performed to an n-type second nitride semiconductor layer 51B, etching does not extend to an interface between the n-type second nitride semiconductor layer 51B and the p-type first nitride semiconductor layer 51A, but is stopped with a remaining portion of the n-type second nitride semiconductor layer 51B having a thickness of several nm to several tens nm.

It has been also found that in the case where the first nitride semiconductor layer 51A has a narrower energy band gap than that of the second nitride semiconductor layer 51B, not only when the first nitride semiconductor layer 51A is doped to be p-type but also when the first nitride semiconductor layer 51A is doped to be n-type, etching can be stopped with a very small remaining portion of the second nitride semiconductor layer 51B.

Figure 2:
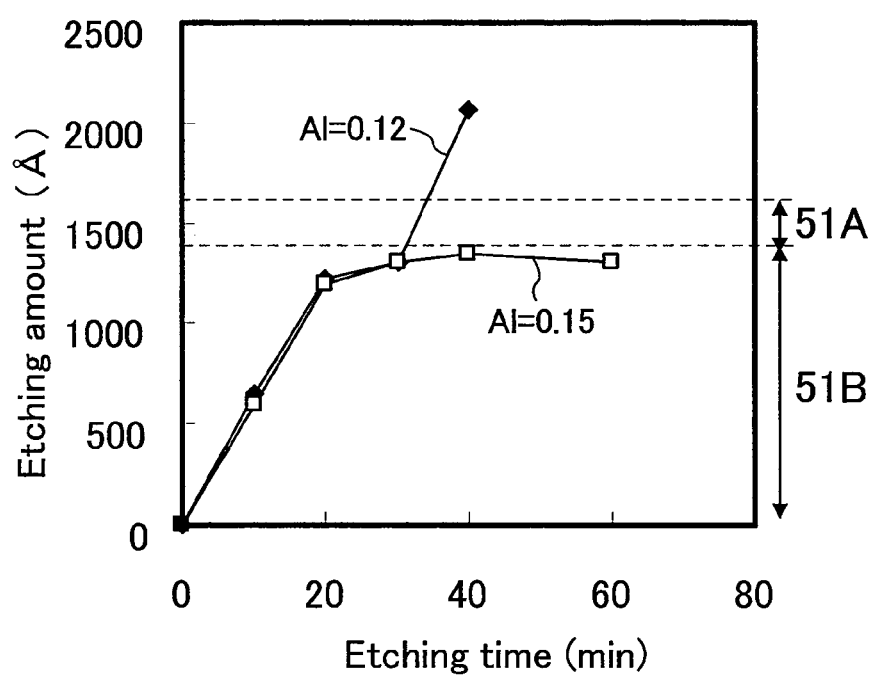
FIG. 2 is a graph showing the relationship between etching time and etching amount for etching of the nitride semiconductor layer of the first embodiment.

The present inventors further examined etching behavior when each of the first nitride semiconductor layer 51A and the second nitride semiconductor layer 51B was n-type. FIG. 2 shows the relationship between etching time and etching amount when the first nitride semiconductor layer was n-GaN and the second nitride semiconductor layer was n-AlGaN. As shown in FIG. 2, with the second nitride semiconductor layer having an Al composition of 0.12, etching stop occurred with a remaining portion of the second nitride semiconductor layer 51B having a thickness of about 5 to 10 nm after a lapse of about 20 minutes since a start of etching. However, when still more time elapsed, then, etching was resumed to extend to the first nitride semiconductor layer 51A. In contrast to this, with the second nitride semiconductor layer 51B having an Al composition of 0.15, once etching stop occurred after a lapse of about 20 minutes, etching was not resumed even after a lapse of another about 60 minutes.

In a general semiconductor fabrication process, it is preferable that, even if etching time largely varies, variations in etching are not caused. With a nitride semiconductor layer having an Al composition of 0.12, etching time has to be strictly controlled in order to improve reproducibility. However, with a nitride semiconductor layer having an Al composition of 0.15, reproducibility can be easily improved.

Figure 3A:
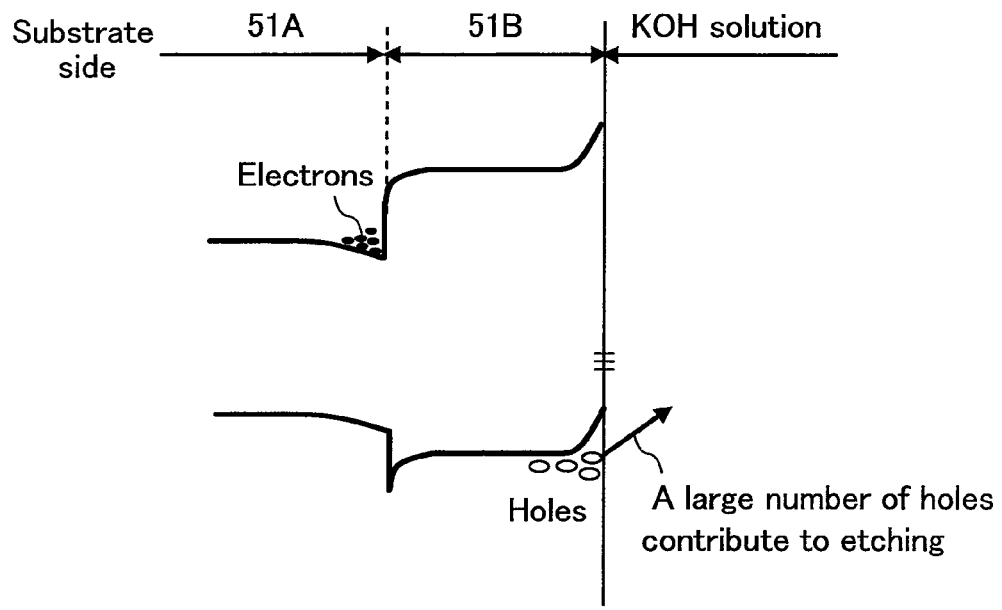
FIGS. 3A and 3B are energy band diagrams for describing an etching mechanism of etching of the nitride semiconductor layer of the first embodiment.
Figure 3B:
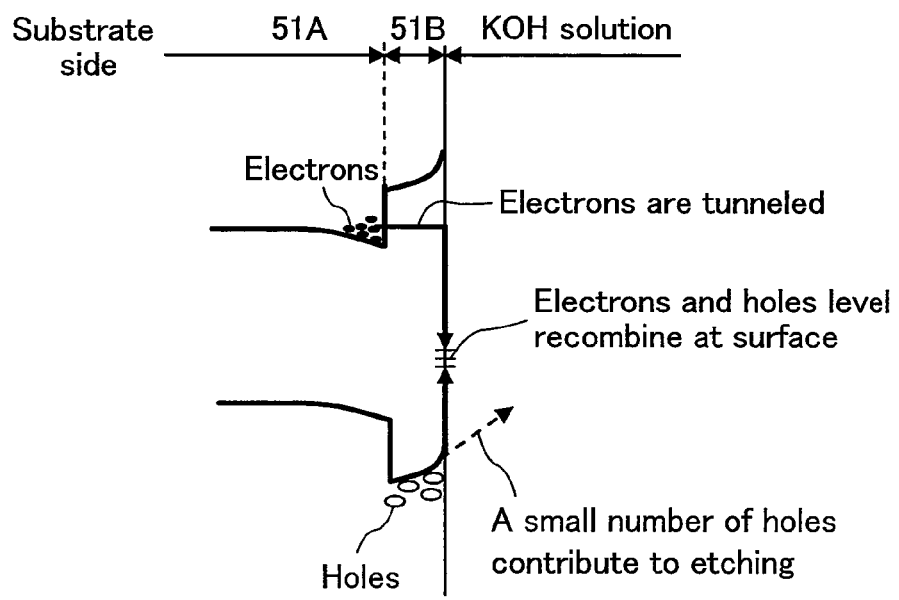

Although the reason why a nitride semiconductor layer having a large Al composition has a higher etching stop function is as yet incompletely understood, the present inventors presume that the reason is as follows. FIG. 3A is an energy band diagram showing a state where the second nitride semiconductor layer has a large thickness at an initial stage of etching. FIG. 3B is an energy band diagram showing a state where the second nitride semiconductor layer has been etched to a thickness of several nm. The second nitride semiconductor layer 51B formed of n-AlGaN and the first nitride semiconductor layer 51A formed of n-GaN have different lattice constants. Thus, when the second nitride semiconductor layer 51B and the first nitride semiconductor layer 51A are in contact with each other, piezoelectric polarization occurs, so that a band structure shown in FIG. 3A is formed. The band structure is characterized in that two-dimensional electron gas tends to gather at an interface area of the first nitride semiconductor layer 51A formed of n-GaN and the second nitride semiconductor layer 51B formed of n-AlGaN.

In the state of FIG. 3A, holes generated due to irradiation of light contribute to etching of the second nitride semiconductor layer 51B, thus causing further etching. However, as shown in FIG. 3B, as a result of the further etching, when the thickness of the second nitride semiconductor layer 51B becomes about 5 nm or less, electron tunneling occurs in the second nitride semiconductor layer 51B, and electrons flow to a surface of the second nitride semiconductor layer 51B. Consequently, electrons and holes tunneled recombine at a surface level. As a result, the concentration of holes contributing to etching is reduced to a very low level, so that etching is almost stopped.

Presumably, the reason why the etching stop function is increased when the Al composition in the second nitride semiconductor layer is increased is because a difference between the lattice constant of the second nitride semiconductor layer 51B and the lattice constant of the first nitride semiconductor layer 51A formed of n-GaN is increased as the Al composition in the second nitride semiconductor layer is increased. Accordingly, a density of two-dimensional electron gas to be induced at the interface area is increased. Thus, the amount of holes to disappear due to recombination is increased, so that the concentration of holes contributing to etching is further reduced.

As described above, when wet etching is performed to a stacked layer structure in which a layer having a larger lattice constant and a layer having a smaller lattice constant are formed in contact with each other in this order from a substrate, etching stop occurs with a very small remaining portion of the layer having a small lattice constant. This etching stop tends to occur when a difference between respective lattice constants of the layers is large. The ratio between the lattice constant of AlGaN having an Al composition of 0.15 in an a-axis direction and the lattice constant of GaN in the a-axis direction is 0.972. Therefore, the second nitride semiconductor layer and the first nitride semiconductor layer are preferably formed so that the ratio between the respective lattice constants in the a-axis is 0.972 or less. Note that the a-axis is substantially parallel to a principal surface of an epitaxial layer.

Figure 4A:
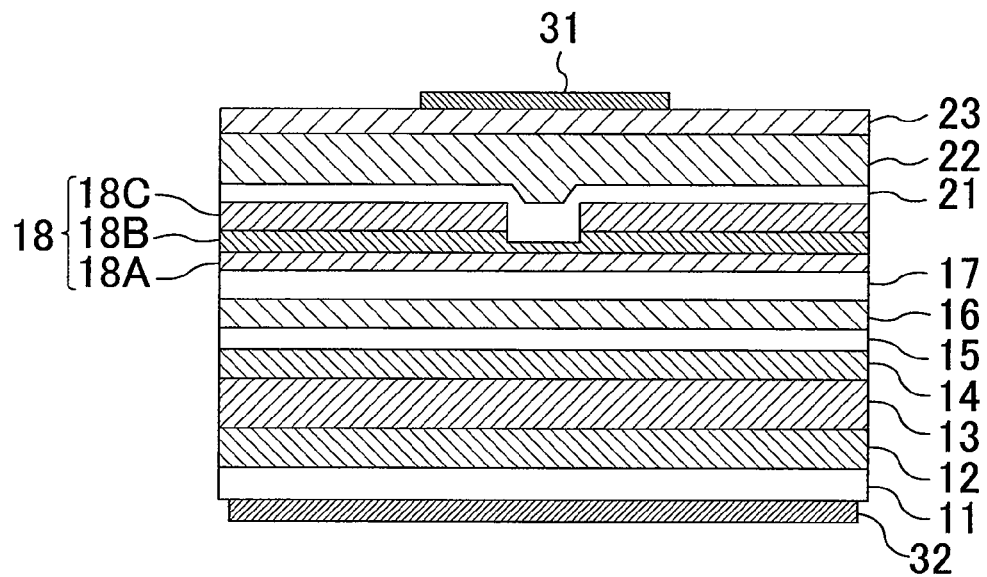
FIGS. 4A and 4B are views of a nitride semiconductor device according to the first embodiment.
Figure 4B:
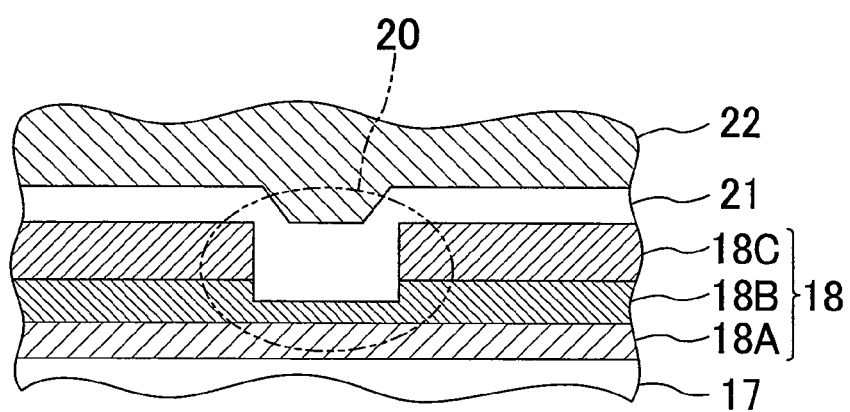

Next, a nitride semiconductor device which is fabricated, based on the results of the above-described experiments, such that etching stop reliably occurs and variations due to etching are reduced will be described. FIG. 4A is a cross-sectional view of the nitride semiconductor device of the first embodiment. FIG. 4B is an enlarged cross-sectional view of a conductive area through which a current flows to an active layer. As shown in FIGS. 4A and 4B, the nitride semiconductor device of the first embodiment is a semiconductor laser device including a buried current confining layer.

A buffer layer 12, an n-type cladding layer 13, an n-type guide layer 14, an active layer 15, an electron barrier layer 16, a first p-type guide layer 17, a current confining layer 18, a second p-type guide layer 21, a p-type cladding layer 22, and a p-type contact layer 23 are formed in this order on a substrate 11. On the p-type contact layer 23, a p-type electrode 31 is formed. On a back surface of the substrate 11, an n-type electrode 32 is formed. When a voltage is applied between the p-type electrode 31 and the n-type electrode 32, a current flows to the active layer 15 through a conductive area 20 formed in the current confining layer 18, thus generating laser oscillation.

The substrate 11 is formed of GaN. The buffer layer 12 is formed of n-GaN. The n-type cladding layer 13 is formed of n-AlGaN. The n-type guide layer 14 is formed of n-GaN. The active layer 15 is a multiple quantum well (MQW) active layer formed of InGaN. The electron barrier layer 16 is formed of p-AlGaN. The first p-type guide layer 17 is formed of p-GaN. The second p-type guide layer 21 is formed of p-GaN. The p-type cladding layer 22 is formed of p-AlGaN. The p-type contact layer 23 is formed of p-GaN.

The current confining layer 18 has a stacked layer structure including a first semiconductor layer 18A formed of n-GaN having a thickness of 20 nm, a second semiconductor layer 18B formed of n-$Al_{0.15}Ga_{0.85}N$ having a thickness of 10 nm, and a third semiconductor layer 18C formed of n-$Al_{0.12}Ga_{0.88}N$ having a thickness of 130 nm stacked in this order. In the current confining layer 18, parts of third semiconductor layer 18C and the second semiconductor layer 18B are removed, and a recess portion is formed therein. The second p-type guide layer 21 is formed so as to fill the recess portion. Parts of the second semiconductor layer 18B and the first semiconductor layer 18A located under the recess portion are inverted to be p-type since a p-type impurity is diffused therein when the second p-type guide layer 21, the p-type cladding layer 22 and the p-type contact layer 23 are regrown. Thus, part of the current confining layer 18 in which the recess portion is formed serves as the conductive area 20 when a voltage is applied between the p-type electrode 31 and the n-type electrode 32.

Figure 5A:
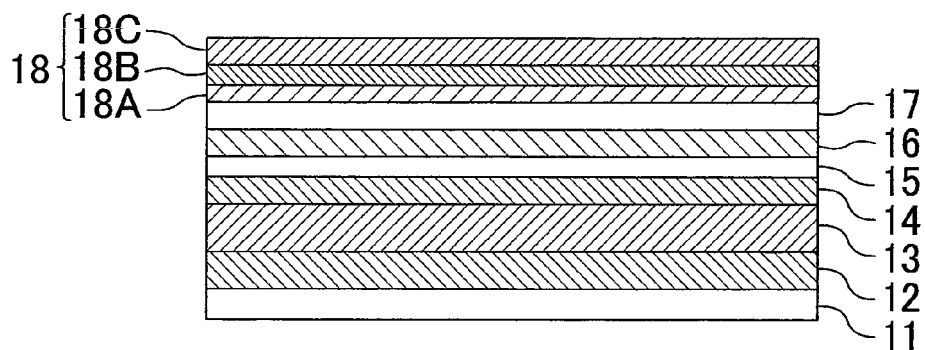
FIGS. 5A through 5C are cross-sectional views illustrating respective steps in sequence for fabricating the nitride semiconductor device of the first embodiment.
Figure 5B:
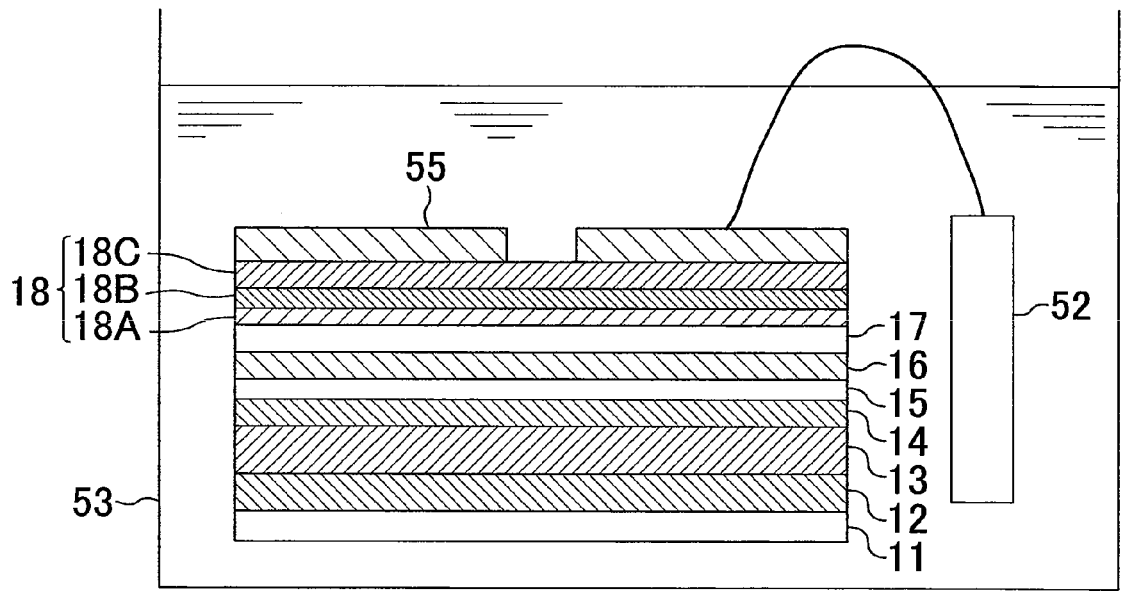
Figure 5C:
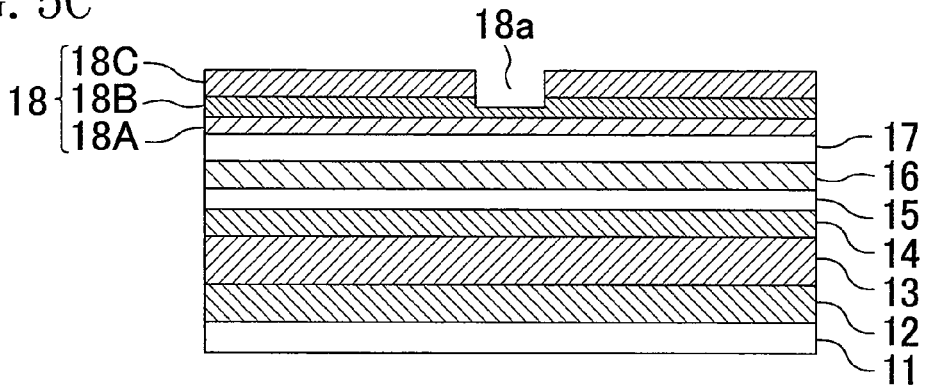

Next, a method for fabrication a nitride semiconductor device according to this embodiment will be described. FIGS. 5A through 5C are cross-sectional views illustrating respective steps in sequence for fabricating the nitride semiconductor device of the first embodiment.

First, as shown in FIG. 5A, a buffer layer 12 of GaN, an n-type cladding layer 13, an n-type guide layer 14, an active layer 15, an electron barrier layer 16, a first p-type guide layer 17, and a current confining layer 18 are formed in this order on a substrate 11 formed of GaN by metal organic chemical vapor deposition (MOCVD). For n-type layers, for example, silicon can be introduced as an n-type impurity. For p-type layers, for example, magnesium can be introduced as a p-type impurity.

The current confining layer 18 has a three-layer structure including a first semiconductor layer 18A formed of n-GaN, a second semiconductor layer 18B formed of n-$Al_{0.15}Ga_{0.85}N$, and a third semiconductor layer 18C formed of n-$Al_{0.12}Ga_{0.88}N$. Compositions of the first semiconductor layer 18A, the second semiconductor layer 18B and the third semiconductor layer 18C will be described in detail later.

Next, as shown in FIG. 5B, after a metal mask 55 is formed on the third semiconductor layer 18C, the metal mask 55 is electrically coupled to a platinum (Pt) cathode 52 and is immersed in an etching solution 53 of KOH or the like. The metal mask 55 is preferably formed of a material such as titanium (Ti) or the like, which can provide a good ohmic contact with the third semiconductor layer 18C. In this state, the current confining layer 18 is irradiated with UV light, so that part of the current confining layer 18 is etched. Note that a surface (group V surface) of the substrate 11 on which an epitaxial layer formed by MOCVD does not exist has to be coated by, for example, a dielectric film or the like, so that the grope V surface is not brought in contact with a chemical solution.

As described above, etching is automatically stopped in a state where exposed part of the third semiconductor layer 18C formed of n-$Al_{0.12}Ga_{0.88}N$ is removed and part of the second semiconductor layer 18B formed of n-$Al_{0.15}Ga_{0.85}N$ remains. Thereafter, the metal mask 55 and the Pt cathode 52 are decoupled, and then, the metal mask 55 is removed using a chemical solution, thereby forming, as shown in FIG. 5C, a current confining layer 18 having a recess portion 18a.

Figure 6A:
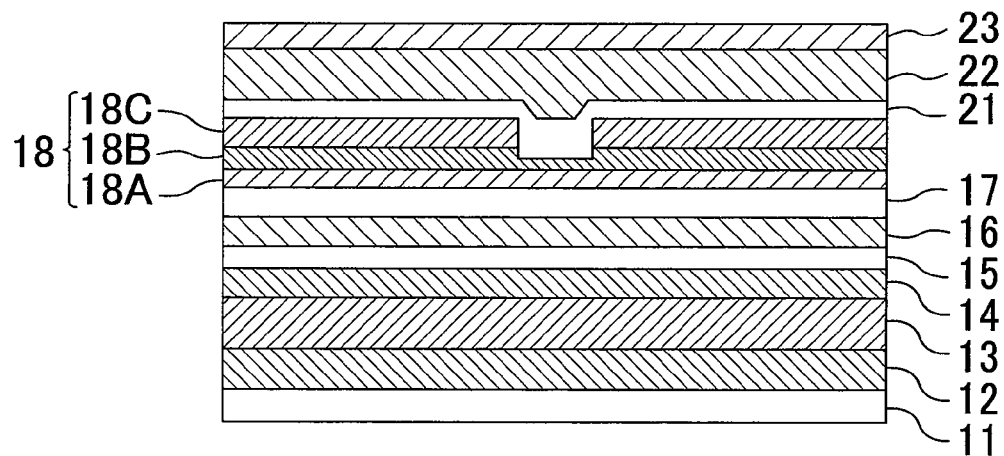
FIGS. 6A and 6B are cross-sectional views illustrating respective steps in sequence for fabricating the nitride semiconductor device of the first embodiment.

Next, as shown in FIG. 6A, a second p-type guide layer 21, a p-type cladding layer 22, and a p-type contact layer 23 are regrown on the current confining layer 18 so as to fill the recess portion 18a using MOCVD. In this process step, a p-type impurity is diffused in respective remaining portions of the second semiconductor layer 18B and the first semiconductor layer 18A under a bottom surface of the recess portion 18a. Thus, parts of the first semiconductor layer 18A and the second semiconductor layer 18B which remain under the bottom surface of the recess portion 18a are converted to p-type.

Next, annealing is performed at 800° C. in a nitrogen atmosphere to activate the p-type impurity. Thereafter, a p-type electrode 31 is formed on the p-type contact layer 23. The p-type electrode 31 is obtained by forming a multilayer film including nickel (Ni) or palladium (Pd) using electron beam (EB) deposition and then sintering the multilayer film.

Figure 6B:
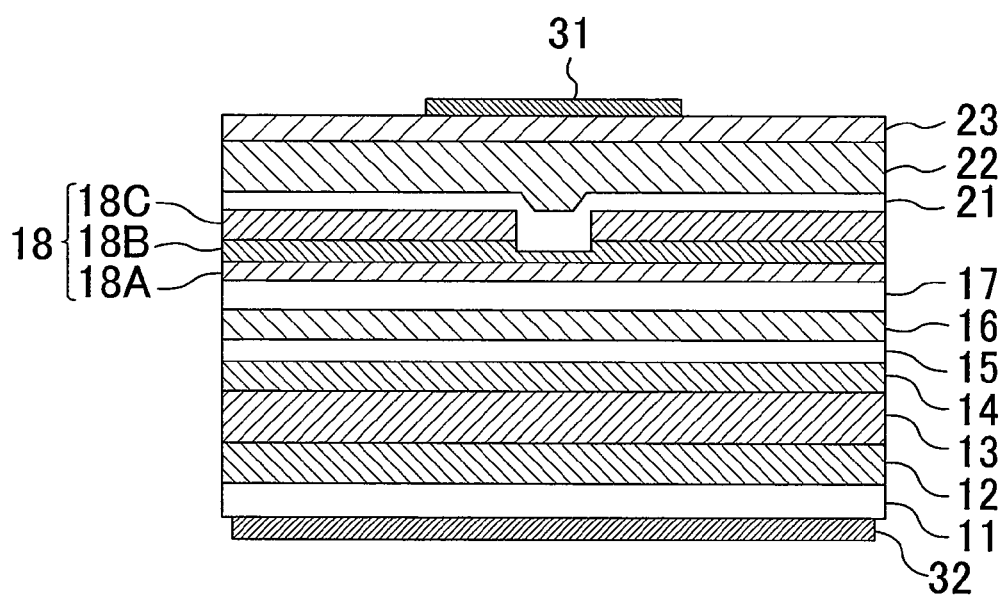

Subsequently, a thickness of a surface of the substrate 11 on which an epitaxial layer formed by MOCVD does not exist is reduced by polishing, and then, an n-type electrode 32 is formed on the polished surface. The n-type electrode 32 is formed of a multilayer film including Ti, vanadium (V) or the like. Thereafter, cleaving is preformed to divide a wafer into chips, thereby forming a semiconductor laser device of FIG. 6B including a buried current confining layer.

Hereinafter, the current confining layer 18 will be described in detail. In this embodiment, the current confining layer 18 has a three-layer structure including the first semiconductor layer 18A formed of n-GaN, the second semiconductor layer 18B formed of n-$Al_{0.15}Ga_{0.85}N$ and the third semiconductor layer 18C formed of n-$Al_{0.12}Ga_{0.88}N$. Each of the second semiconductor layer 18B and the third semiconductor layer 18C has a smaller lattice constant than that of the first semiconductor layer 18A located closest to the substrate 11. The lattice constant of the second semiconductor layer 18B is smaller than that of the third semiconductor layer 18C.

As described above, to cause etching stop to occur, a lattice constant of a semiconductor layer located closer to a substrate has to be larger than that of a semiconductor located closer to a chemical solution. Furthermore, to reliably cause etching stop to occur, a difference between the lattice constants has to be large. In this embodiment, a difference between the lattice constants of the first semiconductor layer 18A and the second semiconductor layer 18B is sufficiently large, so that etching can be stopped with a remaining portion of the second semiconductor layer 18B having a very small thickness on the first semiconductor layer 18A. Therefore, the current confining layer 18 can be also formed so as to include only the first semiconductor layer 18A and the second semiconductor layer 18B.

To ensure the current confining function, the current confining layer 18 has to be formed to have a relatively large thickness at other part than the conductive area. Therefore, when the current confining layer 18 having a two-layer structure including the first semiconductor layer 18A and the second semiconductor layer 18B is formed, the second semiconductor layer 18B has to have a large thickness. When the second semiconductor layer 18B having a high Al composition is grown on the first semiconductor layer 18A formed of n-GaN to a large thickness, cracks tend to be generated. This might cause reduction in yield. Therefore, in this disclosure, the second semiconductor layer 18B is formed to have a relatively small thickness, and then, the third semiconductor layer 18C having a low Al composition is formed thereon to have a relatively large thickness. Thus, the etching stop function during wet etching is improved, and also, the generation of cracks is suppressed.

As long as the second semiconductor layer 18B has a thickness of 5-10 nm, etching stop is reliably caused to occur, so that a remaining portion of the second semiconductor layer 18B is left after wet etching. The Al composition of the second semiconductor layer 18B is at least 0.15 or more when the first semiconductor layer 18A is formed of GaN. When the second semiconductor layer 18B is formed of AlGaN having an Al composition of 0.15 and the first semiconductor layer 18A is formed of GaN, the ratio between the respective lattice constants of the second semiconductor layer 18B and the first semiconductor layer 18A in the a-axis direction is 0.972. In contrast, the Al composition of the third semiconductor layer 18C is preferably 0.12 or less so that the generation of cracks can be suppressed.

In this embodiment, the example where the lattice constant of each layer is changed by changing the Al composition thereof has been described. However, as long as the lattice constant of each layer can be changed, any structure can be used. In general, there is a tendency that as an In composition is increased, a lattice constant is increased, and as an Al composition or a B composition is increased, a lattice constant is reduced. Thus, as a layer whose lattice constant is desired to be small, a layer containing Al or B is used. Then, if the lattice constant is desired to be even smaller, the Al composition or the B composition of the layer is increased. As a layer whose lattice constant is desired to be large, a layer which does not contain Al and B is used, or a layer containing In is used. For example, by using a nitride semiconductor containing In as the first semiconductor layer 18A and nitride semiconductor containing Al as the second semiconductor layer 18B, the difference between the lattice constants of the first semiconductor layer 18A and the second semiconductor layer 18B can be increased. Nitride semiconductors each being represented by a general formula $B_wAl_xGa_yIn_zN$ (where $0 \leq w, x, y, z \leq 1$, $w+x+y+z=1$) and containing at least one of boron, aluminum, gallium, and indium which are group III elements, and nitrogen which is a group V element can be used in a proper combination. In this case, the second semiconductor layer 18B and the first semiconductor layer 18A are preferably formed so that the ratio between their lattice constants in the a-axis direction is 0.972 or less.

Figure 14:
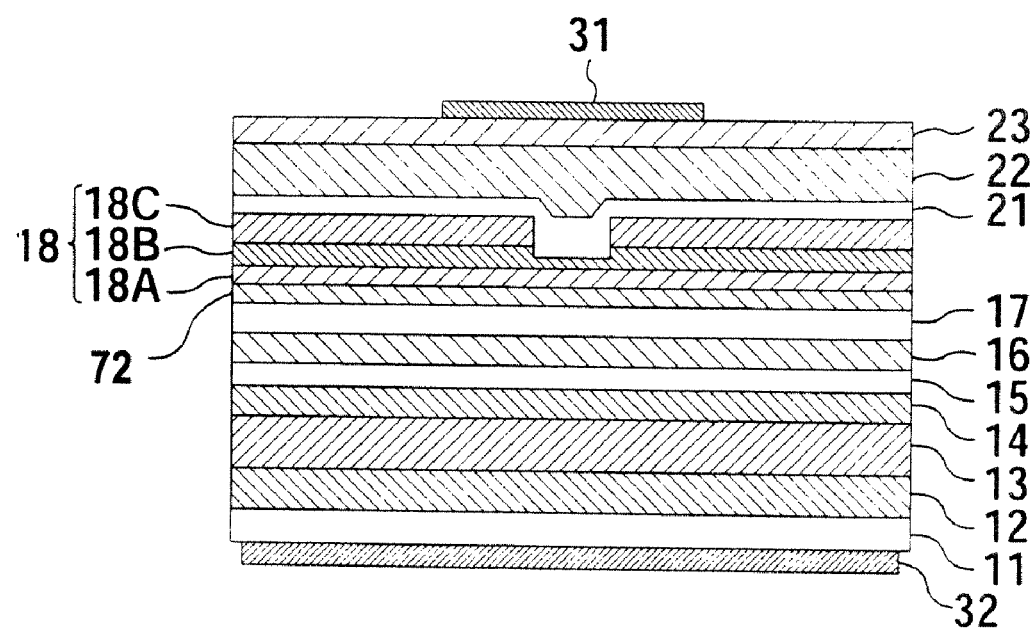
FIG. 14 is a cross-sectional view of a variation of the nitride semiconductor device according to the first embodiment.

Moreover, the current confining layer 18 may be formed to have a four or more layer structure. For example, when a fourth semiconductor layer having a larger lattice constant than that of the first semiconductor layer 18A is formed so as to be located closer to the substrate 11 than the first semiconductor layer 18A, a larger distortion can be generated at an interface between the first semiconductor layer 18A and the second semiconductor layer 18B. Thus, the etching stop function can be further improved. Also, the same effect can be achieved by forming a separate layer from the current confining layer 18, as an intennediate layer 72 having a larger lattice constant than that of the first semiconductor layer 18A, between the current confining layer 18 and the active layer 15, as is shown in FIG. 14.

Second Embodiment

Figure 7A:
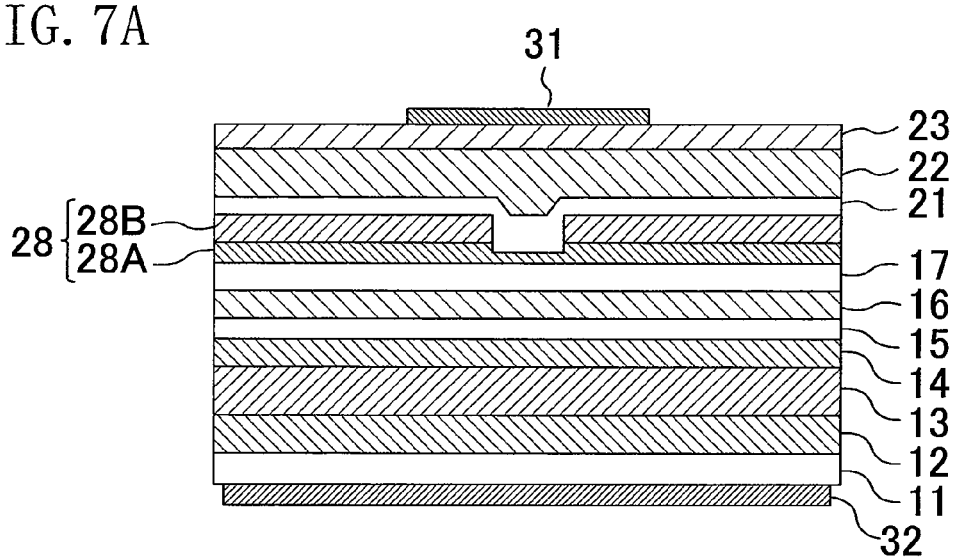
FIGS. 7A and 7B are views of a nitride semiconductor device according to a second embodiment of the present invention.
Figure 7B:
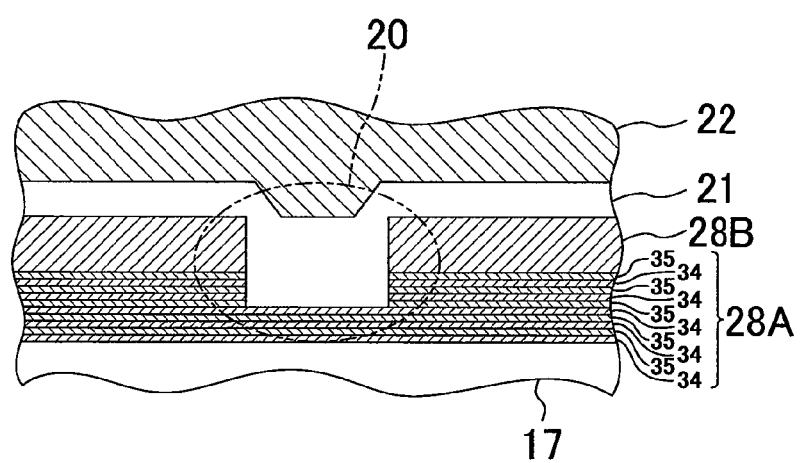

Hereinafter, a second embodiment of the present invention will be described with reference to the accompanying drawings. FIG. 7A is a cross-sectional view of a nitride semiconductor device according to the second embodiment. FIG. 7B is an enlarged cross-sectional view of a conductive area through which a current flows to an active layer. In FIGS. 7A and 7B, each member also shown in FIGS. 4A and 4B is identified by the same reference numeral.

As shown in FIGS. 7A and 7B, in the nitride semiconductor device of the second embodiment, a current confining layer 28 includes a first semiconductor layer 28A and a second semiconductor layer 28B formed on the first semiconductor layer 28A. The first semiconductor layer 28A is a superlattice layer in which five stacking cycles of a first layer 34 formed of n-GaN having a thickness of 2 nm and a second layer 35 formed of $n-Al_{0.12}Ga_{0.88}N$ having a thickness of 2 nm are repeated. The second semiconductor layer 28B is formed of $n-Al_{0.12}Ga_{0.88}N$ having a thickness of 130 nm.

Figure 8A:
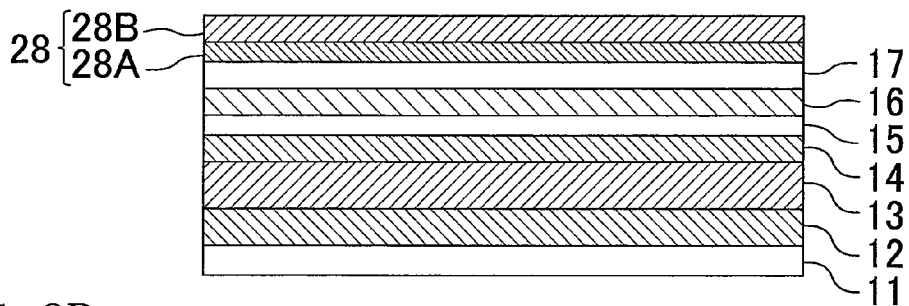
FIGS. 8A through 8C are cross-sectional views illustrating respective steps in sequence for fabricating the nitride semiconductor device of the second embodiment.
Figure 8B:
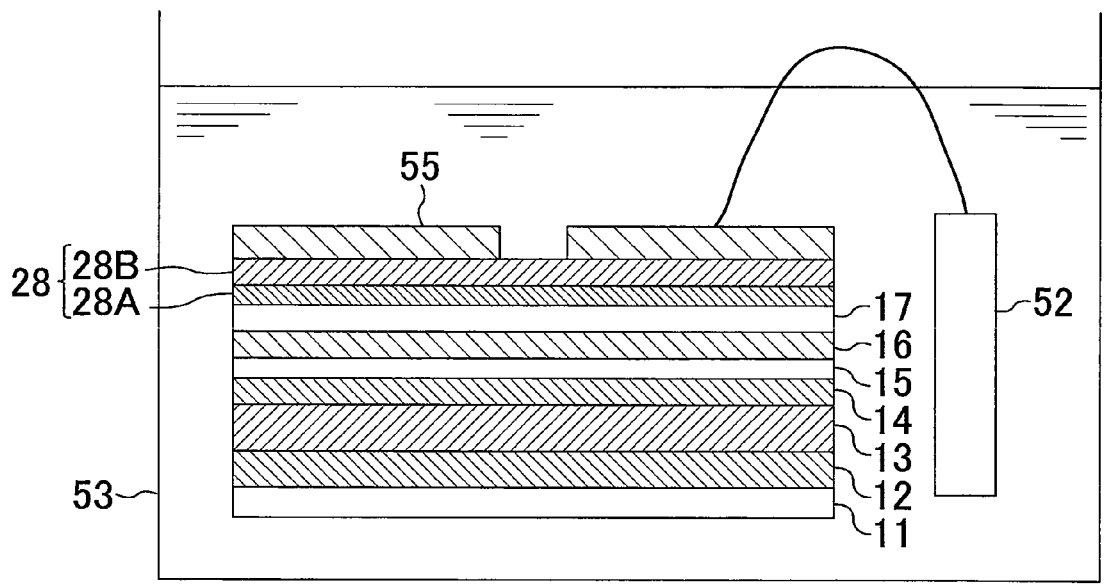
Figure 8C:
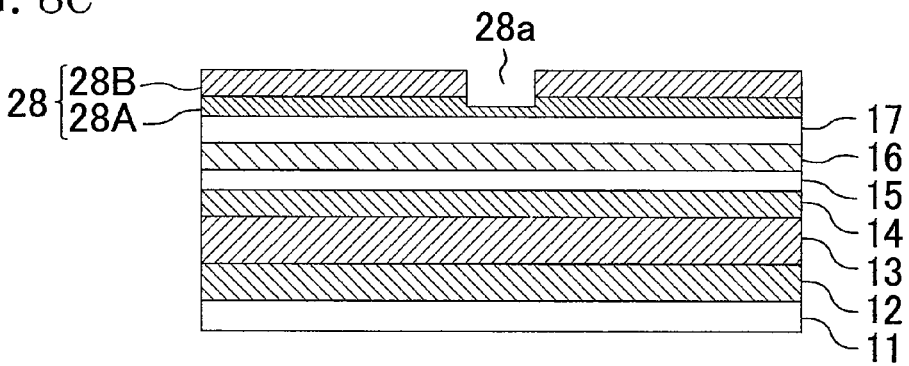

Hereinafter, a method for fabricating the nitride semiconductor device according to the second embodiment will be described with reference to the accompanying drawings. FIGS. 8A through 8C are cross-sectional views illustrating respective steps in sequence for fabricating the nitride semiconductor device of the second embodiment.

First, as shown in FIG. 8A, a buffer layer 12 of GaN, an n-type cladding layer 13, an n-type guide layer 14, an active layer 15, an electron barrier layer 16, a first p-type guide layer 17, and a current confining layer 28 are formed in this order on a substrate 11 formed of GaN by metal organic chemical vapor deposition (MOCVD). To form the current confining layer 28, a superlattice layer is formed by repeating five stacking cycles of a first layer 34 of n-GaN and a second layer 35 of $n-Al_{0.12}Ga_{0.88}N$, and then a second semiconductor layer 28B of $n-Al_{0.12}Ga_{0.88}N$ is formed. Respective compositions of the first semiconductor layer 28A and the second semiconductor layer 28B will be described in detail later.

Next, as shown in FIG. 8B, after a metal mask 55 is formed on the second semiconductor layer 28B, the metal mask 55 is electrically coupled to a Pt cathode 52 and is immersed in an etching solution 53 of KOH or the like. The metal mask 55 is preferably formed of a material such as titanium (Ti) or the like, which provide a good ohmic contact with the second semiconductor layer 28B. In this state, the substrate 11 is irradiated with UV light, so that part of the current confining layer 28 is etched. Note that a surface (group V surface) of the substrate 11 on which an epitaxial layer formed by MOCVD does not exist has to be coated by, for example, a dielectric film or the like, so that the grope V surface is not brought in contact with the chemical solution.

Etching is automatically stopped, so that exposed part of the second semiconductor layer 28B formed of $n-Al_{0.12}Ga_{0.88}N$ is removed and part of the first semiconductor layer 28A which is a superlattice layer remains. Thereafter, the metal mask 55 and the Pt cathode 52 are decoupled, and then, the metal mask 55 is removed using a chemical solution, thereby forming, as shown in FIG. 8C, a current confining layer 28 having a recess portion 28a.

Figure 9A:
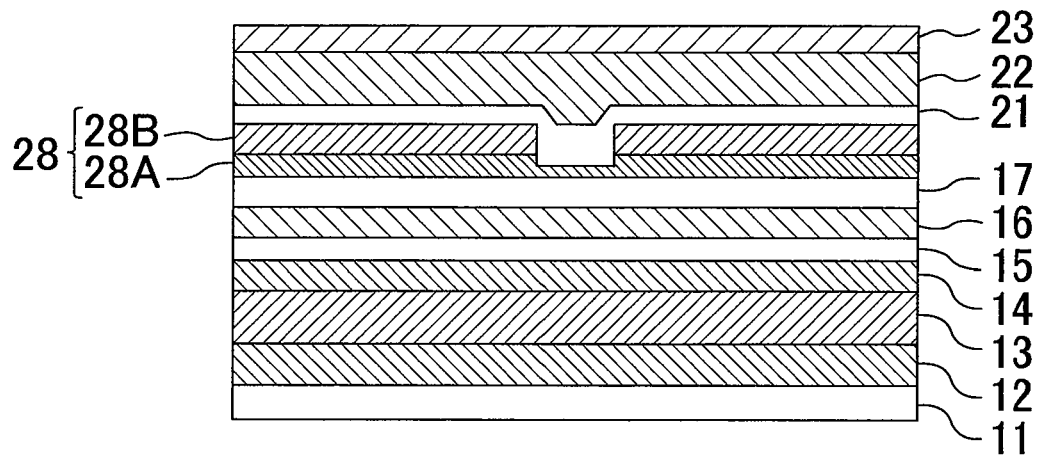
FIGS. 9A and 9B are cross-sectional views illustrating respective steps in sequence for fabricating the nitride semiconductor device of the second embodiment.

Next, as shown in FIG. 9A, a second p-type guide layer 21, a p-type cladding layer 22, and a p-type contact layer 23 are regrown on the current confining layer 28 so as to fill the recess portion 28a by MOCVD. In this process step, a p-type impurity is diffused in a remaining portion of the first semiconductor layer 28A under a bottom surface of the recess portion 28a. Thus, the remaining portion of the first semiconductor layer 28A under a bottom surface of the recess portion 28a is converted to p-type.

Next, annealing is performed at 800° C. in a nitrogen atmosphere to activate the p-type impurity. Thereafter, a p-type electrode 31 is formed on the p-type contact layer 23. The p-type electrode 31 is formed by forming a multilayer film containing nickel (Ni), palladium (Pd) using electron beam (EB) deposition and then sintering the multilayer film.

Figure 9B:
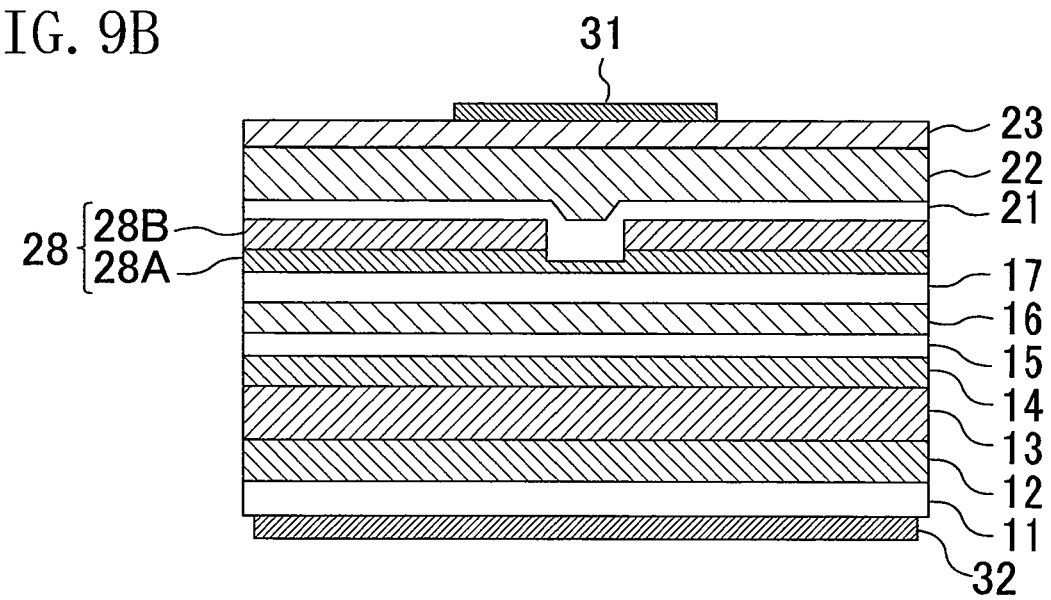

Subsequently, a thickness of a surface of the substrate 11 on which an epitaxial layer formed by MOCVD does not exist is reduced by polishing, and then, an n-type electrode 32 is formed on the polished surface. The n-type electrode 32 is formed of a multilayer film containing Ti, vanadium (V) or the like. Thereafter, cleaving is preformed to divide a wafer into chips, thereby forming a semiconductor laser device of FIG. 9B including a buried current confining layer.

Hereinafter, the current confining layer 28 will be described in detail. In this embodiment, the first semiconductor layer 28A of the current confining layer 28 is a superlattice layer in which five stacking cycles of a first layer 34 of n-GaN and a second layer 35 of n-$Al_{0.12}Ga_{0.88}N$ are repeated. The first layer 34 has a larger lattice constant than that of the second layer 35. Thus, five interfaces at which a layer having a smaller lattice constant is formed on a layer having a larger lattice constant are provided. As described above, etching stop occurs at an interface at which a layer having a smaller lattice constant is formed on a layer having a larger lattice constant. In this embodiment, the first layer 34 is n-GaN and the second layer 35 is n-$Al_{0.12}Ga_{0.88}N$. Thus, when an etching time is increased, etching extends through the interface. However, due to the existence of the five interfaces, the overall etching stop function can be improved. Moreover, since a layer with a high Al composition does not have to be formed, the generation of cracks is not an issue in this embodiment.

In this embodiment, the example where the lattice constant of each layer is changed by changing the Al composition thereof has been described. However, as long as the lattice constant of each layer can be changed, any structure can be used. In general, there is a tendency that as an In composition is increased, a lattice constant is increased, and as an Al composition or a B composition is increased, a lattice constant is reduced. For example, by using a nitride semiconductor containing In as the first layer 34 and nitrite semiconductor containing Al or B as the second layer 35, the difference between the lattice constants at each interface in the superlattice layer can be increased. That is, nitride semiconductors each being represented by a general formula $B_wAl_xGa_yIn_zN$ (where $0 \leq w, x, y, z \leq 1$, $w+x+y+z=1$) and containing at least one of boron, aluminum, gallium, and indium which are group III elements, and nitrogen which is a group V element can be used in a proper combination. Also, in this case, the second layer 35 and the first layer 34 are preferably formed so that the ratio between their lattice constants in the a-axis direction is 0.972 or less.

When the second semiconductor layer 28B has the same composition as that of the second layer 35 of the superlattice layer, the second semiconductor layer 28B can be formed in a simple manner. However, the second semiconductor layer 28B may have a different composition from that of the second layer 35. The number of stacking cycles may be any number as long as it is two or more. However, when five stacking cycles are repeated, the etching stop function can be sufficiently ensured. Each of the layers 34 and 35 constituting the superlattice layer is formed to have a thickness of about 2-3 nm. Furthermore, the layers 34 and 35 are preferably formed so that the first layer 34 having a larger lattice constant is located closest to the substrate. When the second layer 35 having a smaller lattice constant is located lowest, an interface which does not contribute to etching stop is provided.

The current confining layer 28 may be formed to have a three-layer structure. For example, a layer having a larger lattice constant than that of the first layer 34 can be formed at a lower level than the first semiconductor layer 28A, or a layer having a larger lattice constant than that of the second semiconductor layer 28B can be formed at a higher level than the second semiconductor layer 28B.

In each of the first and second embodiments, the case where the nitride semiconductor device is a semiconductor laser device including a buried current confining layer has been described. However, the first and second embodiments are applicable to to nitride semiconductor devices in which an opening portion has to be selectively formed in an n-type semiconductor layer.

In each of the first and second embodiments, the substrate is formed of GaN. However, as long as a nitride semiconductor layer can be grown on the substrate, the substrate may be formed of, instead of GaN, sapphire, silicon, silicon carbide or the like.

Third Embodiment

Figure 10:
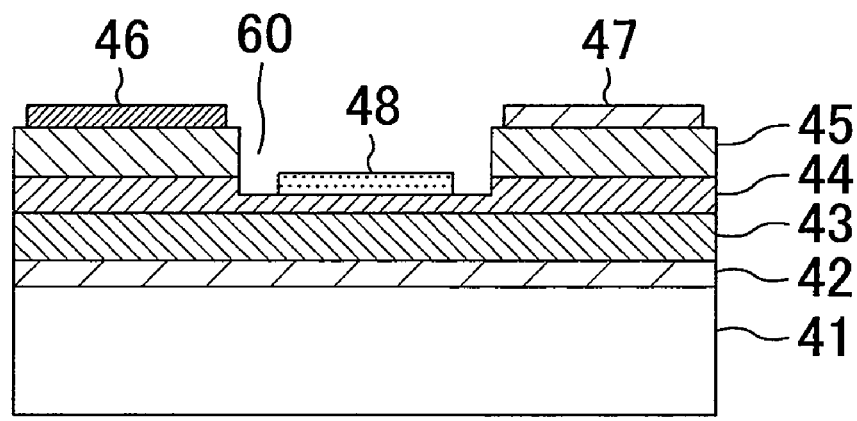
FIG. 10 is a cross-sectional view of a nitride semiconductor device according to a third embodiment of the present invention.

Hereinafter, a third embodiment of the present invention will be described with reference to the accompanying drawings. FIG. 10 is a cross-sectional view of a nitride semiconductor device according to the third embodiment. As shown in FIG. 10, the nitride semiconductor device of this embodiment is a heterojunction field effect transistor (hereinafter referred to as an "HFET") having a recess structure.

A buffer layer 42, a first nitride semiconductor layer 43 of i-GaN or the like, a second nitride semiconductor layer 44 of n-$Al_{0.25}Ga_{0.75}N$, and a third nitride semiconductor layer 45 of n-$Al_{0.12}Ga_{0.88}N$ are formed on a substrate 41 such as a sapphire substrate or the like. Parts of the third nitride semiconductor layer 45 and the second nitride semiconductor layer 44 are removed by etching, thereby forming a recess portion 60 which is a gate recess. Specifically, in the recess portion 60, the second nitride semiconductor layer 44 is not completely removed, but a remaining portion of the second nitride semiconductor layer 44 having a small thickness is left on the first nitride semiconductor layer 43. In the recess portion 60, a gate electrode 48 is formed. An ohmic electrode 46 and an ohmic electrode 47 are formed, respectively, on parts of the third nitride semiconductor layer 45 located at both sides of the recess portion 60. One of the ohmic electrode 46 and the ohmic electrode 47 serves as a source electrode and the other of the electrodes serves as a drain electrode.

Figure 11A:
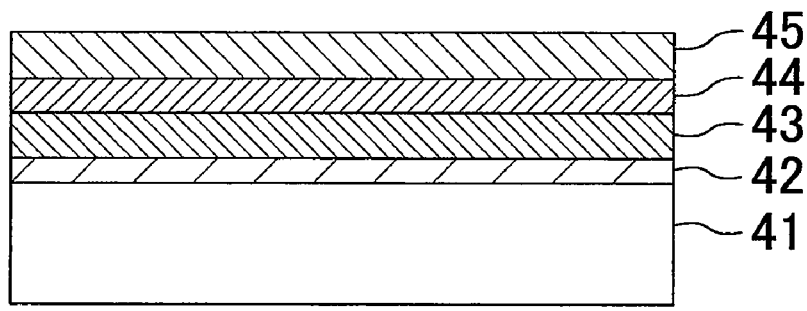
FIGS. 11A through 11C are cross-sectional views illustrating respective steps in sequence for fabricating the nitride semiconductor device of the third embodiment.

Hereinafter, a method for fabricating the HFET according to this embodiment will be described. First, as shown in FIG. 11A, a buffer layer 42, a first nitride semiconductor layer 43, a second nitride semiconductor layer 44 and a third nitride semiconductor layer 45 are formed in this order on a substrate 41 using MOCVD or the like.

Figure 11B:
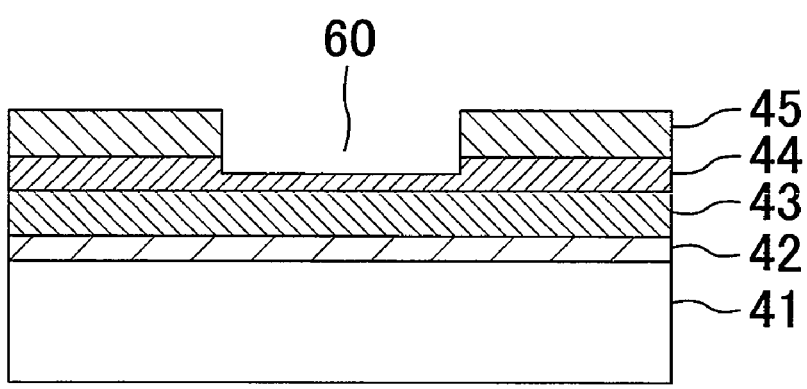
Figure 11C:
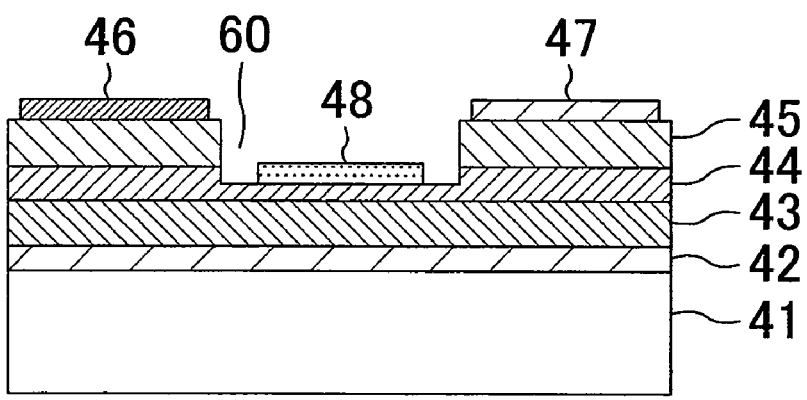

Next, as shown in FIG. 11B, parts of the third nitride semiconductor layer 45 and the second nitride semiconductor layer 44 are removed by PEC etching, thereby forming a recess portion 60. When PEC etching is performed to a stacked body of an n-$Al_{0.12}Ga_{0.88}N$ layer and an n-$Al_{0.25}Ga_{0.75}N$ layer, as described in the first embodiment, etching stop occurs with a remaining portion of the n-$Al_{0.25}Ga_{0.75}N$ layer having a very small thickness. The thickness of the remaining portion of the n-$Al_{0.25}Ga_{0.75}N$ layer is about 5 nm or more. However, the n-$Al_{0.25}Ga_{0.75}N$ layer can be left remaining with a constant thickness and high reproducibility.

Next, an ohmic electrode 46 and an ohmic electrode 47 are formed, respectively, on parts of the third nitride semiconductor layer 45 located at both sides of the recess portion 60. In the recess portion 60, a gate electrode 48 is formed. Each of the ohmic electrode 46, the ohmic electrode 47 and the gate electrode 48 is formed of a known material using a known method. An ohmic recess portion may be formed to extend to a lower level than an interface of the second nitride semiconductor layer 44 and the first nitride semiconductor layer 43, and the ohmic electrode 46 and the ohmic electrode 47 may be formed in the ohmic recess portion. The gate electrode 48 may be formed to completely cover a bottom surface of the recess portion 60. The gate electrode 48 may be also formed to cover the bottom and side surfaces of the recess portion 60.

When etching is performed to the stacked body of the third nitride semiconductor layer 45 of n-$Al_{0.12}Ga_{0.88}N$ and the second nitride semiconductor layer 44 formed of n-$Al_{0.25}Ga_{0.75}N$, an etching amount varies. Due to variations in etching amount, a threshold voltage Vth of the HFET varies. However, in this embodiment, etching can be stopped with a remaining portion of the second nitride semiconductor layer 44 having a very small thickness. Moreover, variations in thickness of the remaining portion of the second nitride semiconductor layer 44 can be reduced. Thus, the HFET can be fabricated with high yield.

Fourth Embodiment

Figure 12:
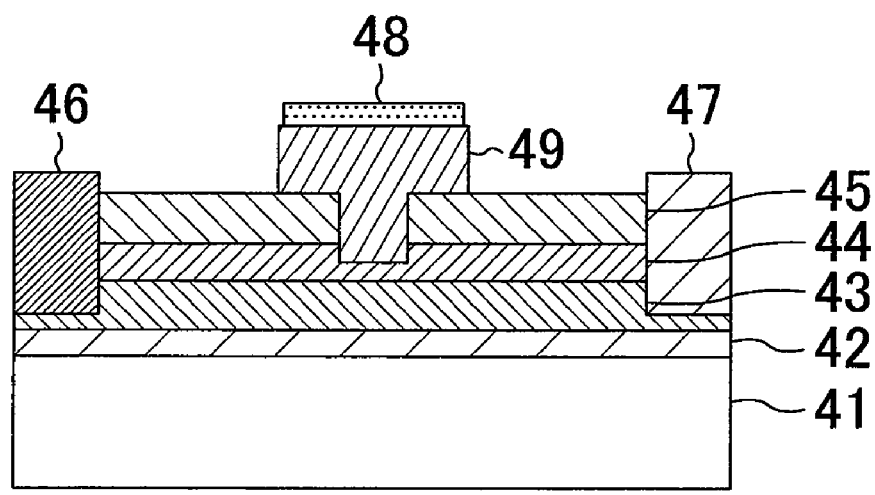
FIG. 12 is a cross-sectional view of a nitride semiconductor device according to a fourth embodiment of the present invention.

Hereinafter, a fourth embodiment of the present invention will be described with reference to the accompanying drawings. FIG. 12 is a cross-sectional view of a nitride semiconductor device according to the fourth embodiment. In FIG. 12, each member also shown in FIG. 10 is identified by the same reference numeral.

In a HFET according to this embodiment, a p-type fourth nitride semiconductor layer 49 is formed in a recess portion formed by removing parts of a third nitride semiconductor layer 45 and a second nitride semiconductor layer 44. The fourth nitride semiconductor layer 49 is formed of, for example, p-GaN, p-AlGaN or the like. A gate electrode 48 is formed on the fourth nitride semiconductor layer 49. An ohmic electrode 46 and an ohmic electrode 47 are formed in an ohmic recess portion and extend to a lower level than an interface of the second nitride semiconductor layer 44 and the first nitride semiconductor layer 43.

Hereinafter, a method for fabricating the HFET according to this embodiment will be described. First, as in the third embodiment, a buffer layer 42, a first nitride semiconductor layer 43, a second nitride semiconductor layer 44 and a third nitride semiconductor layer 45 are formed in this order on a substrate 41 using MOCVD or the like.

Figure 13A:
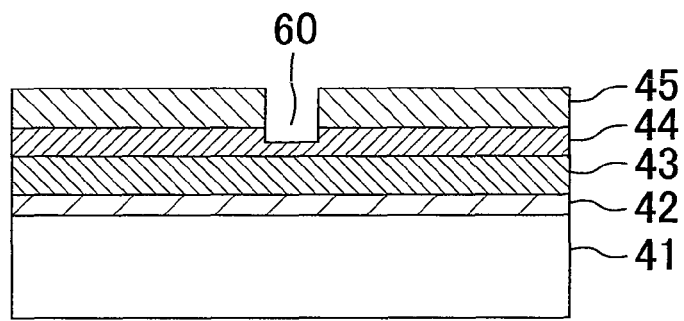
FIGS. 13A through 13E are cross-sectional views illustrating respective steps in sequence for fabricating the nitride semiconductor device of the fourth embodiment.

Next, as shown in FIG. 13A, parts of the third nitride semiconductor layer 45 and the second nitride semiconductor layer 44 are removed by PEC etching, thereby forming a recess portion 60. When PEC etching is performed to a stacked body of an n-$Al_{0.12}Ga_{0.88}N$ layer and an n-$Al_{0.25}Ga_{0.75}N$ layer, as described in the first embodiment, etching stop occurs with a remaining portion of the n-$Al_{0.25}Ga_{0.75}N$ layer having small thickness. The thickness of the n-$Al_{0.25}Ga_{0.75}N$ layer is about 5 nm or more. However, the n-$Al_{0.25}Ga_{0.75}N$ layer having a constant thickness can be left remaining with a constant thickness and high reproducibility.

Figure 13B:
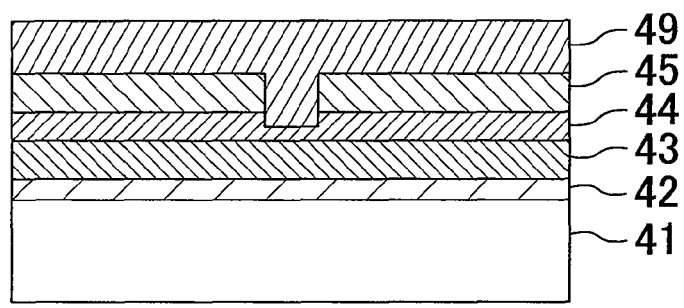

Next, as shown in FIG. 13B, p-GaN, p-AlGaN or the like are regrown entirely over the substrate 41, thereby forming a fourth nitride semiconductor layer 49.

Figure 13C:
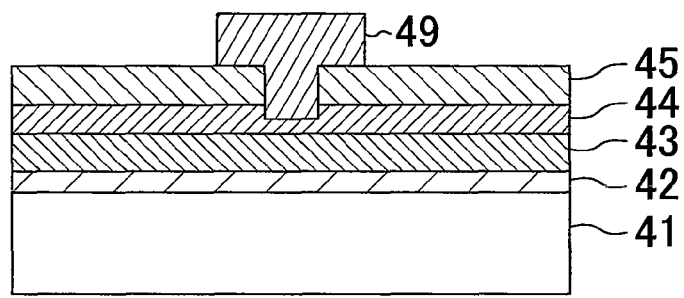

Next, as shown in FIG. 13C, the fourth nitride semiconductor layer 49 is removed so that only part of the fourth nitride semiconductor layer 49 located in and around the recess portion. Thus, the fourth nitride semiconductor layer 49 is provided so as to cover bottom and side surfaces of the recess portion and also part of the third nitride semiconductor layer 45 located around the recess portion.

Figure 13D:
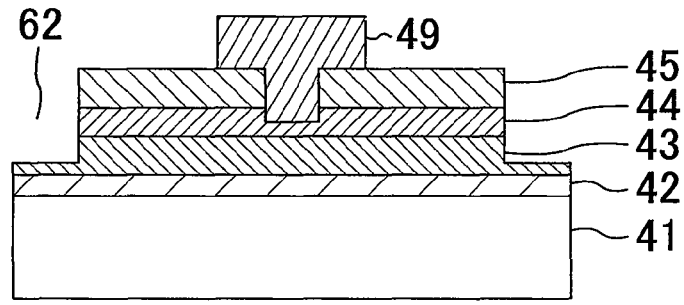

Next, as shown in FIG. 13D, parts of the third nitride semiconductor layer 45, second nitride semiconductor layer 44 and first nitride semiconductor layer 43 located at both sides of the p-type fourth nitride semiconductor layer 49 are removed by etching, thereby forming an ohmic recess portion 62.

Figure 13E:
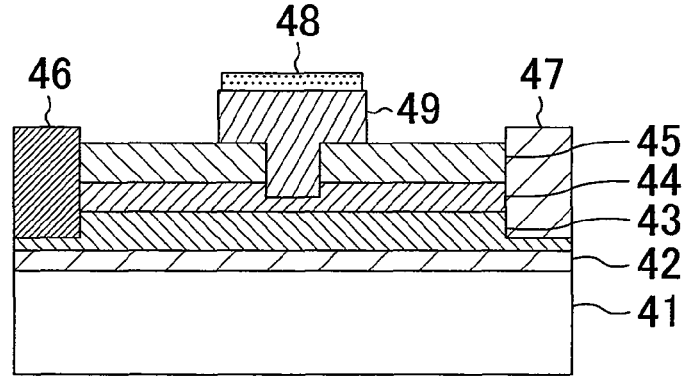

Next, as shown in FIG. 13E, an ohmic electrode 46 and an ohmic electrode 47 are formed to fill the ohmic recess portion. A gate electrode 48 is formed on the fourth nitride semiconductor layer 49.

When etching is performed to the stacked body of the third nitride semiconductor layer 45 formed of n-$Al_{0.12}Ga_{0.88}N$ and the second nitride semiconductor layer 44 formed of n-$Al_{0.25}Ga_{0.75}N$, an etching amount varies. Due to variations in etching amount, a threshold voltage Vth of the HFET varies. However, in this embodiment, etching can be stopped with a remaining portion of the second nitride semiconductor layer 44 having a very small thickness. Moreover, variations in thickness of the remaining portion of the second nitride semiconductor layer 44 can be reduced. Thus, the HFET can be fabricated with high yield.

In each of the third and fourth embodiments, the first nitride semiconductor layer 43 is formed of GaN and the second nitride semiconductor layer 44 is formed of n-$Al_{0.25}Ga_{0.75}N$. However, the first nitride semiconductor layer 43 and the second nitride semiconductor layer 44 may be formed of different materials in a different combination, as long as the second nitride semiconductor layer 44 has a smaller lattice constant than that of the first nitride semiconductor layer 43 and a wider band gap than that of the first nitride semiconductor layer 43. In general, there is a tendency that as an In composition is increased, a lattice constant is increased, and as an Al composition or a B composition is increased, a lattice constant is reduced. There is also a tendency that, as a lattice constant is reduced, a band gap is increased. Thus, as a layer whose lattice constant is desired to be small, a layer containing Al or B is used. Then, if the lattice constant is desired to be even smaller, the Al composition or the B composition of the layer is increased. As a layer whose lattice constant is desired to be large, a layer which does not contain Al and B, or a layer containing In is used. Therefore, nitride semiconductor represented by a general formula $B_wAl_xGa_yIn_zN$ (where $0 \leq w, x, y, z \leq 1$, $w+x+y+z=1$), containing at least one of boron, aluminum, gallium, and indium which are group III elements, and nitrogen which is a group V element can be used in a proper combination. In this case, the second nitride semiconductor layer 44 and the first nitride semiconductor layer 43 are preferably formed so that the ratio between their lattice constants in the a-axis direction is 0.972 or less. The second nitride semiconductor layer dose not have to be n-type, but may be i-type. The third nitride semiconductor layer 45 is formed to have a lattice constant that is smaller than that of the first nitride semiconductor layer 43 and larger than that of the second nitride semiconductor layer 44.

In each of the third and fourth embodiments, the substrate is formed of sapphire. However, as long as a nitride semiconductor layer can be grown on the substrate, the substrate may be formed of, instead of sapphire, GaN, silicon, silicon carbide or the like.

As described above, according to this disclosure, a nitride semiconductor device in which degradation of device characteristics due to etching damage and variations in device characteristics due to variations in etching are suppressed can be achieved. Therefore, the nitride semiconductor device of this disclosure is useful as a nitride semiconductor device in which a recess portion is formed by etching, and particularly, as a nitride semiconductor device including a buried current confining layer.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

FIG. 14 is a cross-sectional view of a variation of the nitride semiconductor device according to the first embodiment.

Moreover, the current confining layer 18 may be formed to have a four or more layer structure. For example, when a fourth semiconductor layer having a larger lattice constant than that of the first semiconductor layer 18A is formed so as to be located closer to the substrate 11 than the first semiconductor layer 18A, a larger distortion can be generated at an interface between the first semiconductor layer 18A and the second semiconductor layer 18B. Thus, the etching stop function can be further improved. Also, the same effect can be achieved by forming a separate layer from the current confining layer 18, as an intermediate layer 72 having a larger lattice constant than that of the first semiconductor layer 18A, between the current confining layer 18 and the active layer 15, as is shown in FIG. 14.

What is claimed is:

1. A nitride semiconductor device comprising:
    an n-type cladding layer formed on a substrate;
    an active layer formed on the n-type cladding layer;
    a current confining layer formed on the active layer and having a recess portion; and
    a p-type cladding layer formed on the current confining layer,
    wherein the current confining layer includes a first semiconductor layer, a second semiconductor layer formed on and in contact with the first semiconductor layer, and a third semiconductor layer formed on and in contact with the second semiconductor layer,
    the second semiconductor layer has a smaller lattice constant than a lattice constant of the first semiconductor layer,
    the third semiconductor layer has a lattice constant that is smaller than the lattice constant of the first semiconductor layer and larger than the lattice constant of the second semiconductor layer, and
    the recess portion of the current confining layer from which parts of the third semiconductor layer and the second semiconductor layer are removed serves as a conductive area through which a current flows to the active layer, and is configured so that the recess portion passes through the third semiconductor layer and a portion of the second semiconductor layer such that the recess portion does not extend completely through the second semiconductor layer.

2. The nitride semiconductor device of claim 1, wherein each of the first semiconductor layer, the second semiconductor layer and the third semiconductor layer is formed of nitride semiconductor represented by a general formula $B_w Al_x In_y Ga_z N$ (where $0 \leq w, x, y, z \leq 1$, $w+x+y+z=1$).

3. The nitride semiconductor device of claim 2, wherein the first semiconductor layer contains indium.

4. The nitride semiconductor device of claim 2, wherein each of the second semiconductor layer and the third semiconductor layer contains boron, and
    the second semiconductor layer has a larger boron composition than a boron composition of the third semiconductor layer.

5. The nitride semiconductor device of claim 2, wherein the third semiconductor layer has a larger aluminum composition than an aluminum composition of the first semiconductor layer, and
    the second semiconductor layer has a larger aluminum composition than the aluminum composition of the third semiconductor layer.

6. The nitride semiconductor device of claim 5, wherein the first semiconductor layer is formed of GaN, and
    the second semiconductor layer is formed of AlGaN having an aluminum composition of approximately 0.15 or more.

7. The nitride semiconductor device of claim 1, wherein the second semiconductor layer has a thickness of approximately 10 nm or less.

8. The nitride semiconductor device of claim 1, further comprising:
    an intermediate layer formed between the current confining layer and the active layer and having a larger lattice constant than the lattice constant of the first semiconductor layer.

* * * * *